United States Patent [19]

Iwamura et al.

[11] Patent Number: 5,345,421
[45] Date of Patent: Sep. 6, 1994

[54] HIGH SPEED, LOW NOISE SEMICONDUCTOR STORAGE DEVICE

[75] Inventors: Masahiro Iwamura; Tatsumi Yamauchi, both of Hitachi; Makoto Saeki, Koganei; Hideaki Uchida, Takasaki, all of Japan

[73] Assignee: Hitachi, Ltd., Tokyo, Japan

[21] Appl. No.: 905,745

[22] Filed: Jun. 29, 1992

[30] Foreign Application Priority Data

Jun. 28, 1991 [JP] Japan ................... 3-158057

[51] Int. Cl.⁵ ........................................... H03K 19/00
[52] U.S. Cl. ................................. 365/189.05; 307/473; 307/443; 307/451
[58] Field of Search ............... 307/451, 473, 469, 441, 307/465.1, 443; 365/189.01, 189.03, 189.05, 230.03, 230.08, 189.06, 203

[56] References Cited

U.S. PATENT DOCUMENTS

| 4,527,081 | 7/1985 | Stewart | 365/189.05 |
| 5,159,573 | 10/1992 | Yamada | 365/189.01 |
| 5,239,214 | 8/1993 | Segawa et al. | 307/451 |

FOREIGN PATENT DOCUMENTS

59-70314 4/1984 Japan .
59-181828 10/1984 Japan .
63-24721 2/1988 Japan .

Primary Examiner—Eugene R. LaRoche
Assistant Examiner—Vu Le
Attorney, Agent, or Firm—Antonelli, Terry, Stout & Kraus

[57] ABSTRACT

A wide-bit output semiconductor storage device of high speed and low noise is provided in which output circuits are grouped into two groups and the two output circuit groups are so controlled as to be switched in directions of levels which are opposite to each other.

26 Claims, 11 Drawing Sheets

| 195 | 176 | 151 | 505 |
|-----|-----|-----|-----|
| 0 | 0 | 0 | 0 |
| 0 | 0 | 1 | 1 |
| 0 | 1 | 0 | Z |
| 0 | 1 | 1 | Z |
| 1 | 0 | 0 | 1 |
| 1 | 0 | 1 | 1 |
| 1 | 1 | 0 | Z |
| 1 | 1 | 1 | Z |

| 195 | 176 | 156 | 705 |
|---|---|---|---|
| 0 | 0 | 0 | 0 |
| 0 | 0 | 1 | 1 |
| 0 | 1 | 1 | Z |
| 0 | 1 | 1 | Z |
| 1 | 0 | 0 | 0 |
| 1 | 0 | 1 | 0 |
| 1 | 1 | 0 | Z |
| 1 | 1 | 1 | Z |

HIGH SPEED, LOW NOISE SEMICONDUCTOR STORAGE DEVICE

BACKGROUND OF THE INVENTION

1. Field of the Invention

The present invention relates to semiconductor storage devices and more particularly to techniques of reducing noise in high-speed wide-bit output memories.

2. Description of the Related Art

As the performance of microprocessors including RISC's advances, there is a growing need for high-speed wide-bit output standard memories mainly used as cache memories. In wide-bit memories of, for example, ×8 output or ×16 output, on the other hand, output circuits are driven simultaneously when reading data and consequently large noise voltages are generated on internal power supply and ground lines, leading to erroneous operations of memory cells and internal circuits. Since the magnitude of noise voltage is proportional to a rate of change of current di/dt of the output circuit, compatibility of high speed with low noise is, in general, difficult to maintain. This problem is one of the most difficult technical problems encountered in development of high speed semiconductor memories. The problem has gradually been solved by improved circuit techniques and packaging techniques but such previous solutions seem to face a limit. For example, it is almost impossible for the present-day technique to realize a high-speed standard SRAM of ×16 output having access time equivalent to that of a high-speed standard SRAM of ×8 output.

JP-A-59-70314 discloses a technique of reducing noise due to simultaneous driving by making drive times of a plurality of output circuits different. This technique can advantageously achieve effective noise reduction but, disadvantageously, it increases delay time.

JP-A-59-181828 discloses a technique of reducing noise due to simultaneous driving by presetting output circuits to an intermediate potential between the power supply potential and a ground potential in advance. This technique, however, raises a problem that when the output is at the intermediate level, a circuit receiving the output is so affected by noise as to be liable to operate erroneously.

JP-A-63-24721 discloses a technique of reducing noise due to simultaneous driving by controlling rise time and fall time of the output circuit. In this technique, because of controlling of the rise time and fall time, delay time is disadvantageously increased.

As described above, the prior arts art devices fail to establish compatibility between reduction of noise due to simultaneous driving and high-speed operation.

SUMMARY OF THE INVENTION

The present invention contemplates elimination of the above problem and its object is to provide a semiconductor storage device and a semiconductor integrated circuit device which can permit compatibility of noise reduction with high-speed operation.

According to a feature of the present invention in a semiconductor storage device having a plural-bit output, a plurality of output circuits allotted to a high potential pin and a low potential pin are sorted into two groups, and after one of the output circuit groups is driven toward a high level and the other output circuit group is driven toward a low level by a control signal in advance of delivery of read data from the memory, the two output circuit groups are driven in accordance with the read data.

Thus, according to an embodiment of the invention, when one output circuit group is driven toward the high level, the other output circuit group is driven toward the low level. Accordingly, if the number of the output circuits is the same for the two groups, maximum drive currents drawn to a power supply pin and a ground pin are respectively halved as compared to those of the prior arts, thereby ensuring that compatibility between noise reduction and high-speed operation can be established.

DESCRIPTION OF THE PREFERRED EMBODIMENTS

The invention will now be described by way of example with reference to the accompanying drawings.

Figure 1:
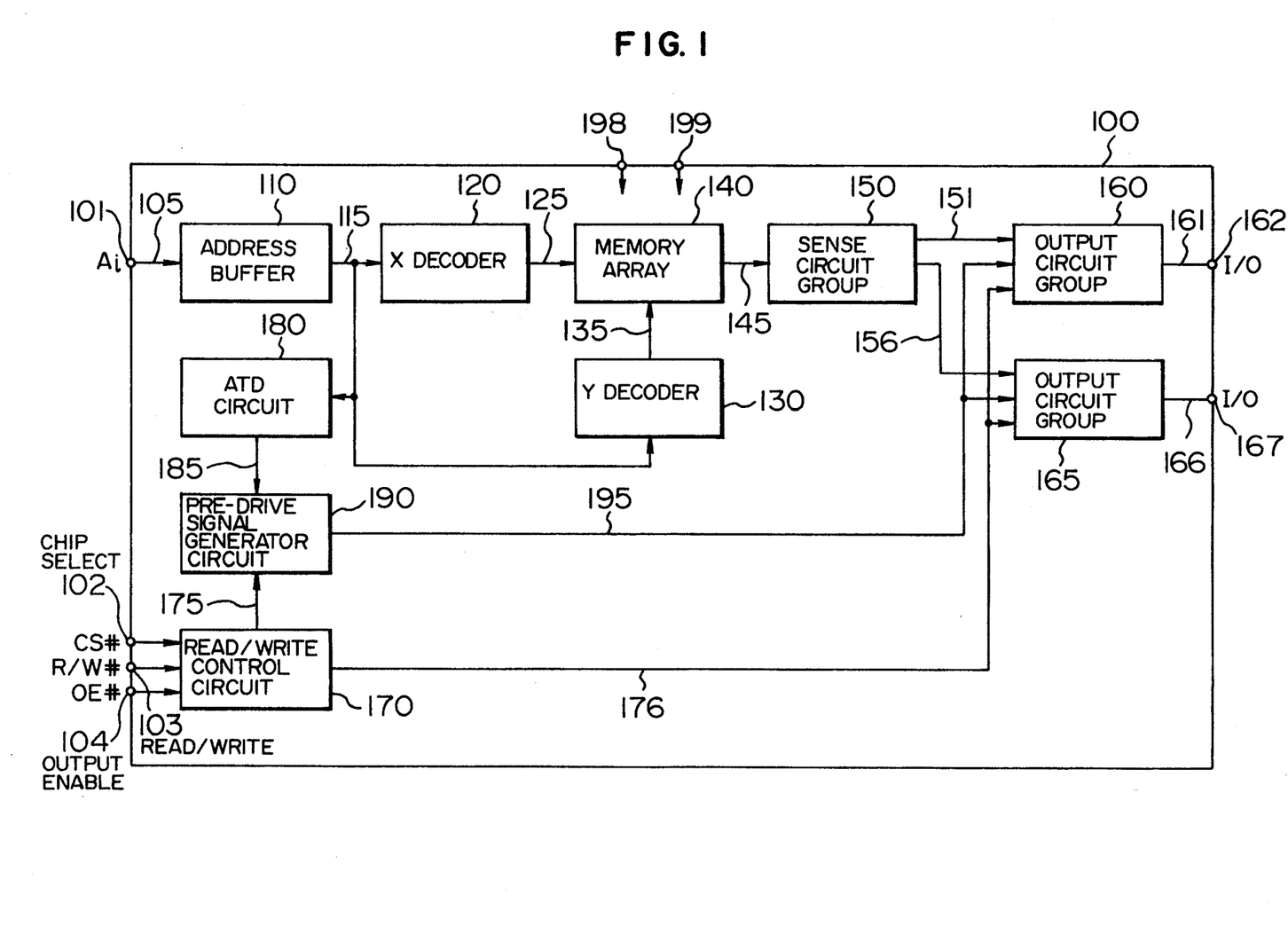
FIG. 1 is a block diagram showing an embodiment of a semiconductor storage device according to the invention.

Referring now to FIG. 1, there is shown, in block form, an SRAM according to a first embodiment of the invention having a chip 100. An address buffer 110 receives an address signal Ai of plural bits at an Ai terminal 101 and distributes it to internal circuits. An X decoder 120 and a Y decoder 130 respectively produce output signals 125 and 135 which act as a selection signal for a memory array 140. An output signal 145 of the memory array is amplified by a sense circuit group 150 and delivered to signal lines 151 and 156. An output circuit group 160 receives the input signal 151 and delivers an output signal 161 to an input/output (I/O) terminal 162, and an output circuit group 165 receives the input signal 156 and delivers an output signal 166 to an input/output (I/O) terminal 167. A read/write control circuit 170 receives a chip select signal CS# at a terminal 102, a read/write control signal R/W# at a terminal 103 and an output enable signal OE # at a terminal 104 and generates various kinds of control signals for read operation and write operation. A signal 175 becomes true during read operation and a signal 176 controls operation enable of the output circuit groups 160 and 165. An address transition detector (ATD) 180 produces an access start pulse signal 185 when the address signal Ai changes. A pre-drive signal generator circuit (hereinafter abbreviated as PDG circuit) 190 responds to the signals 175 and 185 to generate a pulse signal 195 for driving the output circuit groups 160 and 165. Denoted by 198 and 199 are an internal power supply terminal and a ground terminal, respectively.

In the invention, during read access, the signal 195 from the PDG circuit 190 drives the output circuit group 160 toward a high level (or a low level) in advance of delivery of the read signal 151 and the output circuit group 165 toward the low level (or the high level) in advance of delivery of the read signal 156. At expiration of a predetermined time interval, the signal 195 is disabled and thereafter the output circuit groups 160 and 165 are driven by the read signals 151 and 156 to deliver read data to the terminals 162 and 167.

Accordingly, the output circuit groups 160 and 165 are always driven to the opposite levels. Therefore, while one of the output circuit group draws current from the power supply terminal 198, the other passes current to the ground terminal 199, so that noises generated on the power supply and ground lines owing to simultaneous driving can be reduced significantly.

The terminals 162 and 167 are also connected with input circuit groups which are not directly related to the present invention and will not be described herein.

Figure 2:
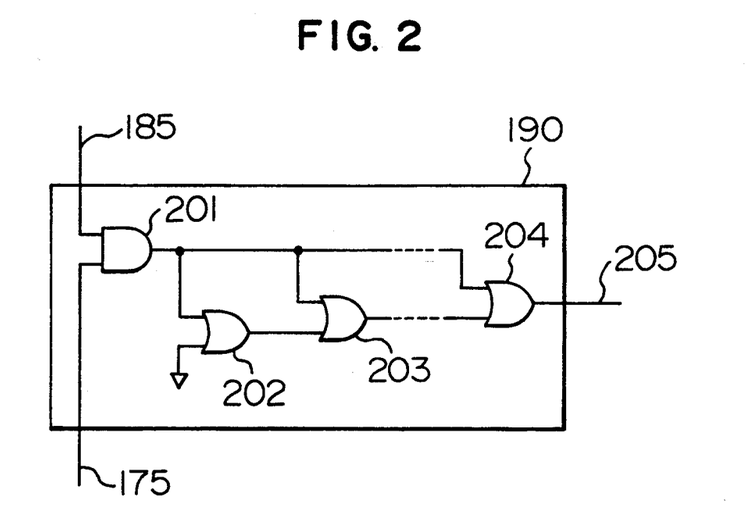
FIG. 2 is a circuit diagram of an embodiment of a pre-drive circuit.
Figure 3:
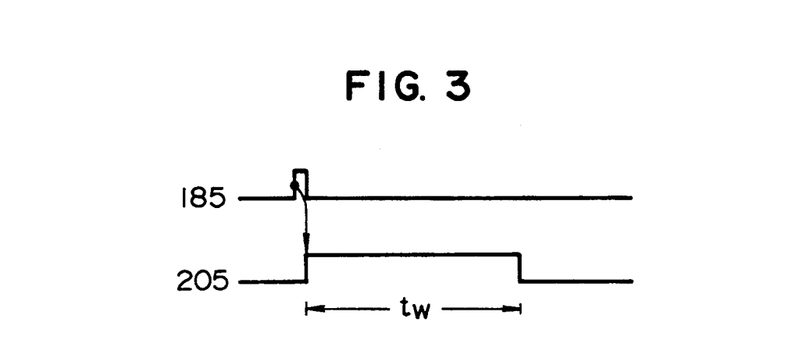
FIG. 3 is a time chart for the pre-drive circuit.

The PDG circuit 190 may be constructed specifically as shown in FIG. 2, though this specified construction not being limitative. As shown, the PDG circuit 190 includes an AND gate 201 and OR gates 202 to 204, and it receives the signals 185 and 175 to produce a signal 205 of a predetermined time width (tw). FIG. 3 is a time chart of operation of the PDG circuit 190.

In the present embodiment of the invention, the output signal 185 of the ATD circuit 180 is used as the input signal to the PDG circuit 190 but the invention is not limited thereto. The PDG circuit is simply required to detect the start timing for access to the memory array 140 and for example, it may utilize a clock pulse for input latch in an STRAM (self timed RAM) and an RAS# signal or a CAS# signal in a DRAM.

Figure 4:
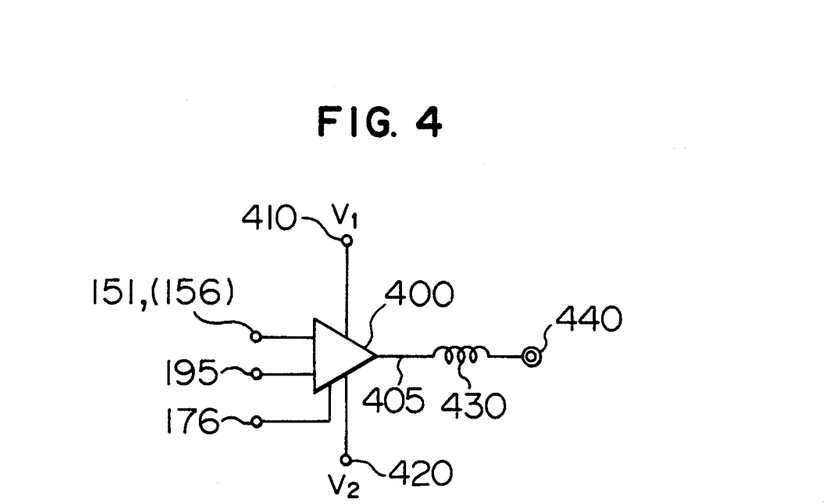
FIG. 4 is a schematic circuit diagram of an output circuit.

FIG. 4 is a schematic circuit diagram of an output circuit applicable to the present invention. The output circuit shown at 400 in FIG. 4 may be constructed of a CMOS circuit, a BiCMOS circuit, an ECL circuit, a TTL circuit, a GaAs circuit or the like circuit. An internal power supply terminal 410 and a ground terminal 420 are connected to pins of a package and a parasitic inductance 430 accompanying leads of the package and internal wiring takes place. Denoted by 440 is an output pin of the package. The output circuit 400 is applied with the input signals 151 (156),195 and 176 and when the signal 176 is false, its output assumes a high impedance regardless of the other input signals. On the other hand, when the signal 176 is true, the output is driven toward the high level or the low level if the signal 195 is true but is driven in accordance with the signal 151 (156) if the signal 195 is false.

Figure 5:
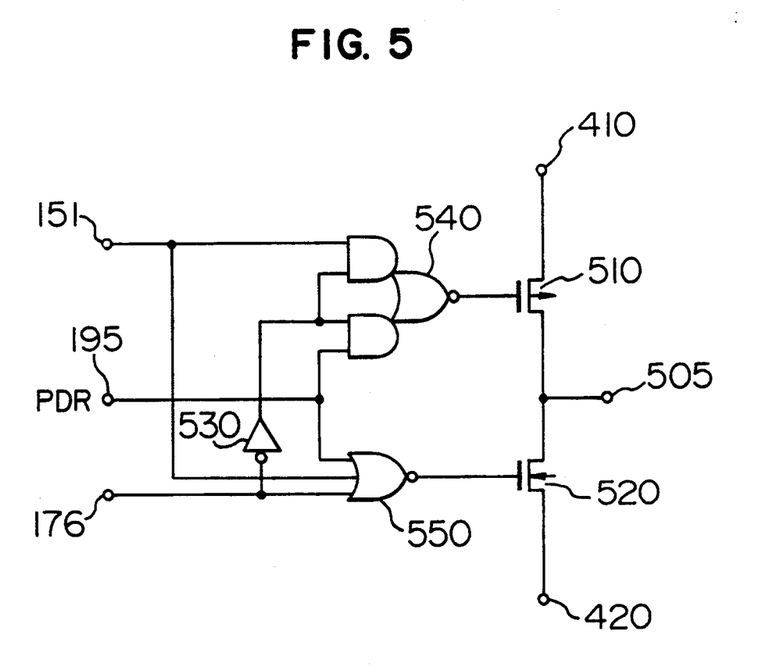
FIG. 5 is a circuit diagram showing a first embodiment of the output circuit.
Figure 6:
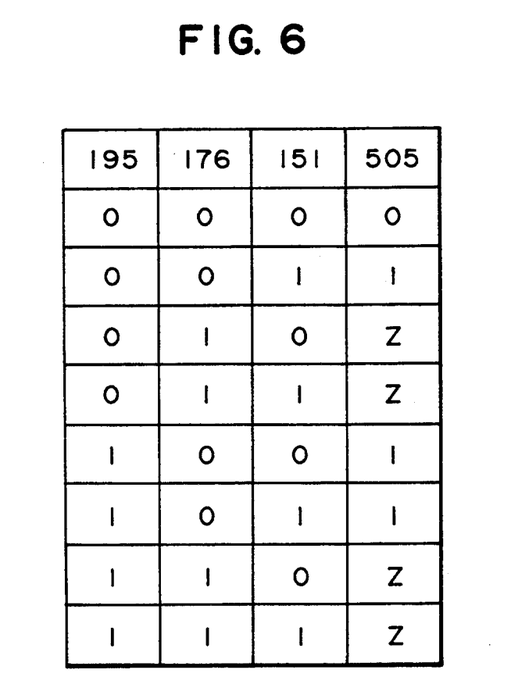
FIG. 6 shows a truth table of the FIG. 5 output circuit.

FIG. 5 shows an embodiment of the FIG. 4 output circuit which is constructed of a CMOS circuit. In the figure, a PMOS 510 has its drain connected to an output 505, its gate connected to one input and its source connected to a power supply terminal 410. An NMOS 520 has its drain connected to the output 505, its gate connected to the other input and its source connected to ground 420. An inverter 530 receives at its input the signal 176 and delivers an inverted signal. An AND-OR-inverter circuit 540 receives the signals 151 and 195 and the output signal of the inverter 530 to on/off control the PMOS 510. A NOR gate 550 receives the signals 151,195 and 176 to on/off control the NMOS 520. A truth table of this circuit is shown in FIG. 6. As is clear from FIG. 6, this circuit has, in addition to the function of a conventional tri-state circuit, the function of driving the output 505 toward the high level when the signal 176 is at the low level and the signal 195 is at the high level.

Figure 7:
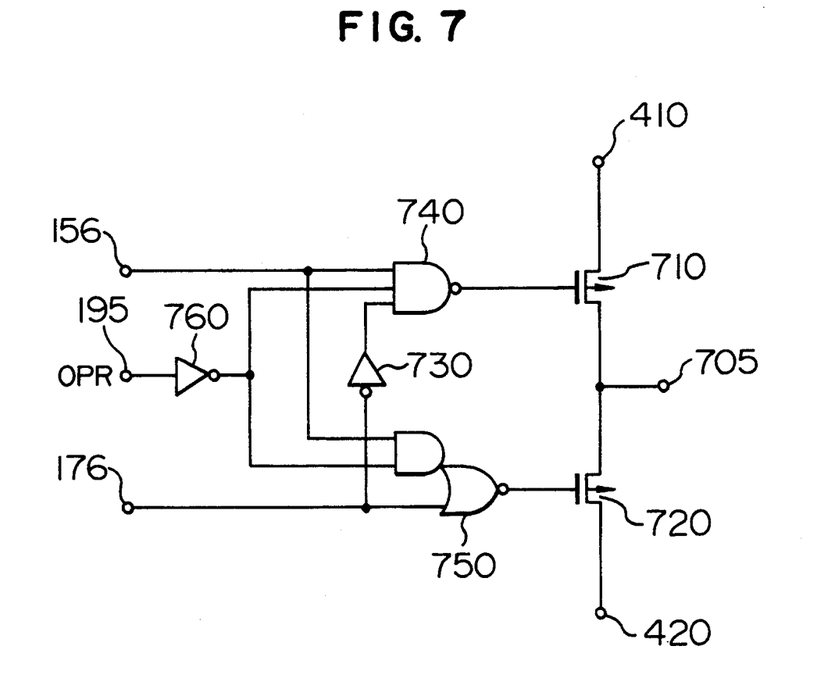
FIG. 7 is a circuit diagram showing a second embodiment of the output circuit.
Figure 8:
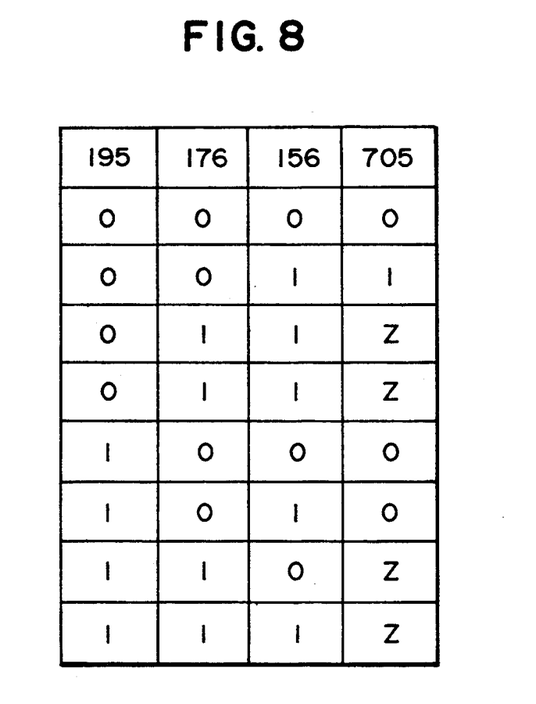
FIG. 8 shows a truth table of the FIG. 7 output circuit.

FIG. 7 shows another embodiment of the FIG. 4 output circuit which is constructed of a CMOS circuit. In the figure, a PMOS 710 has its drain connected to an output 705, its gate connected to one input and its source connected to a power supply terminal 410. An NMOS 720 has its drain connected to the output 705, its gate connected to the other input and its source connected to ground 420. An inverter 730 receives at its input the signal 176 and delivers an inverted signal. An inverter 760 receives at its input the signal 195 and delivers an inverted signal. A NAND gate 740 receives the signal 156 and the output signals of the inverters 730 and 760 to on/off control the PMOS 710. An AND-OR-inverter circuit 750 receives the signals 156 and 176 and the output signal of the inverter 7.60 to on/off control the NMOS 720. FIG. 8 shows a truth table of this circuit. As is clear from FIG. 8, this circuit has, in addition to the function of a conventional tristate circuit, the function of driving the output 505 toward the low level when the signal 176 is at the low level and the signal 195 is at the high level.

Figure 9:
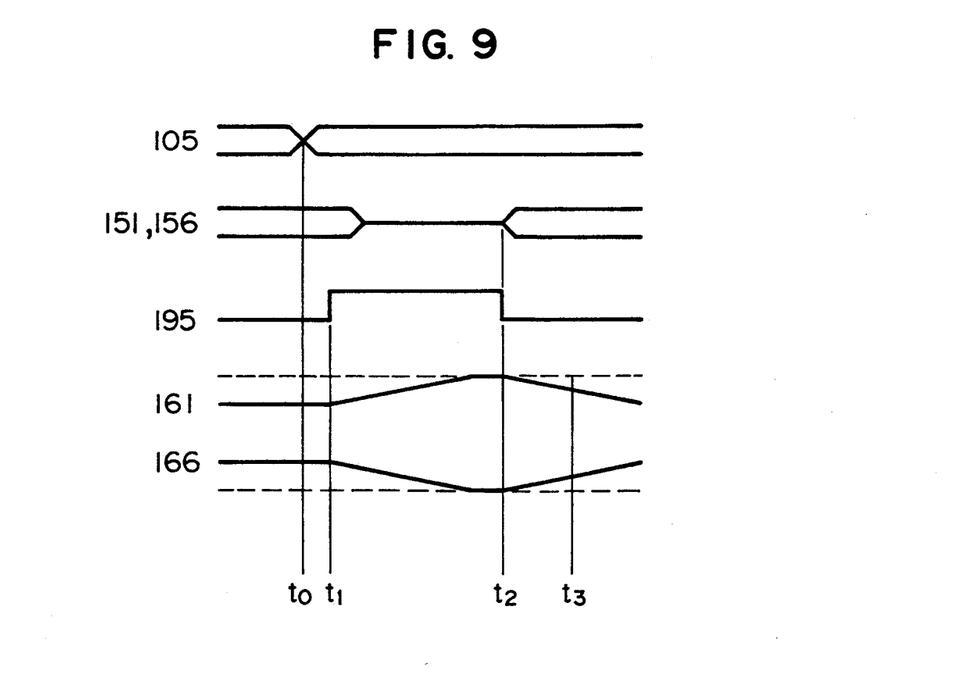
FIG. 9 is a time chart showing operation of the semiconductor storage device.

FIG. 9 is a time chart of operation of the semiconductor storage device according to the present embodiment of the invention. As shown, after the address signal 105 changes at time to, the output signals 151 and 156 of the sense circuit are delivered at time t2. In this operation, the output signal 195 of the PDG circuit is rendered to be high level during an interval of time from t1 to t2. Of the output signals 161 from the output circuit group 160, those assuming the low level are driven toward the high level during the period for the high level of signal 195 as shown in FIG. 9 and after time t2, they are either kept to be high level or driven toward the low level in accordance of the level of signal 151 and then read out at time t3. Similarly, of the output signals 166 from the output circuit group 161, those assuming the high level are driven toward the low levels during the period for the high level of signal 195 as shown in FIG. 9 and after time t2, they are either kept to be low level or driven toward the high level in accordance with the level of signal 156 and then read out at time t3.

Figure 10:
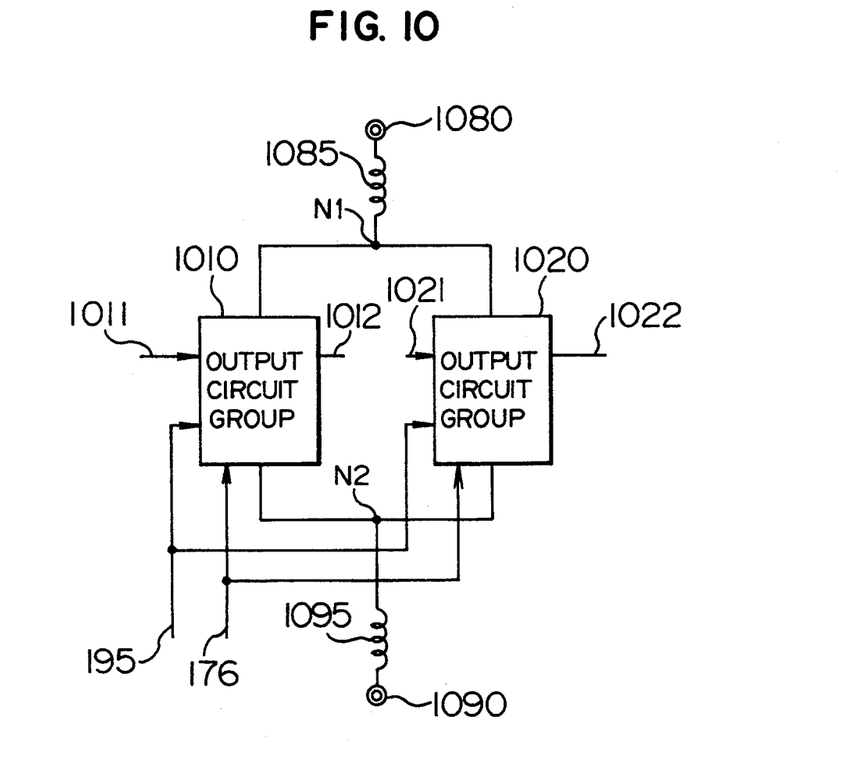
FIG. 10 is a schematic circuit diagram of a second embodiment of the semiconductor storage device according to the invention.

FIG. 10 shows a second embodiment of the semiconductor storage device according to the invention. The present device comprises a first output circuit group 1010 including a plurality of output circuits, a second output circuit group 1020 including a plurality of output circuits, a power supply pin 1080, and a ground pin 1090. A parasitic inductance 1085 takes place between the power supply pin 1080 and a power supply node N1 and a parasitic inductance 1095 takes place between the ground pin 1090 and a ground node N2.

In the present embodiment, the output circuit groups 1010 and 1020 operate as follows. Firstly, when the signal 176 is false, outputs 1012 and 1022 of the output circuit groups 1010 and 1020 assume a high impedance. With the signal 176 being true, when the signal 195 initially assumes the high level for a predetermined interval of time, the output 1012 of the output circuit group 1010 is driven toward the high level and the output 1022 of the output circuit group 1020 is driven toward the low level. Thereafter, the output circuit group 1010 is either kept to be high level or driven toward the low level in accordance with the level of output signal 1011 of the sense circuit group 150. Similarly, the output circuit group 1020 is either kept to be low level or driven toward the high level in accordance with the level of output signal 1021 of the sense circuit group 150. Accordingly, if the number of the output circuits is the same for the two output circuit groups, maximum drive currents drawn to the inductances 1085 and 1095 are respectively halved as compared to those of the prior arts. As a result, noises induced at the nodes N1 and N2 owing to simultaneous driving can be reduced to permit high-speed operation. For example, according to the invention, the noise level in a memory of ×16 output is equivalent to that of a memory of ×8 output and the noise level of a memory of ×8 output is equivalent to that of a memory of ×4 output, thus ensuring realization of a wide-bit output high-speed memory.

Figure 15:
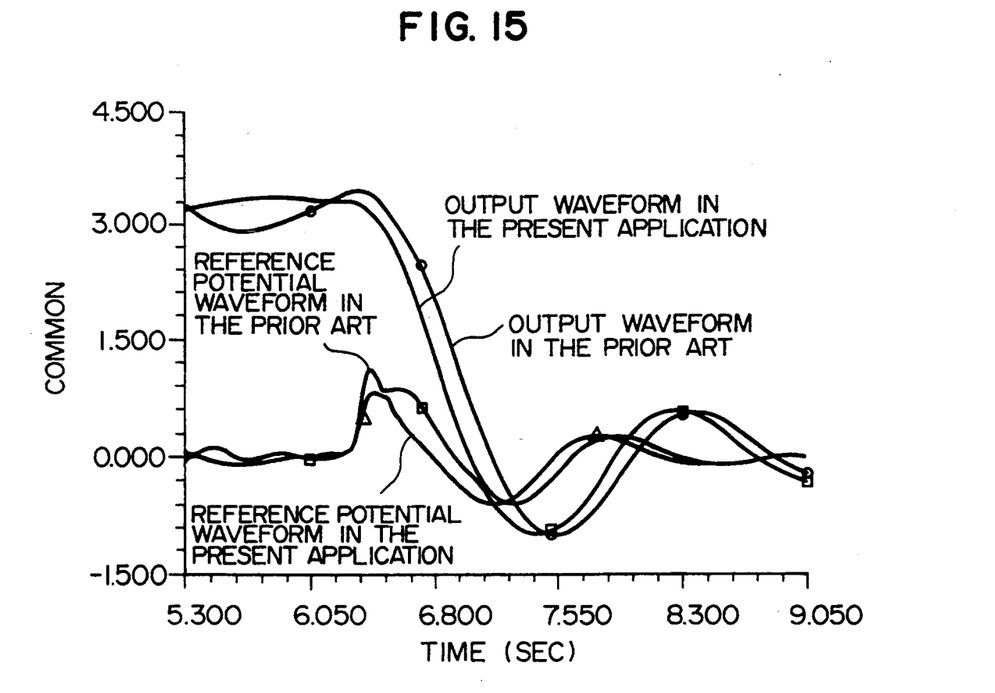
FIG. 15 is a graph showing simulation waveforms.

FIG. 15 shows simulation waveforms for a CMOS output circuit of ×8 output. The simulation is carried out under the condition that the power supply voltage is 3.3 V, the load capacity is 100 pF and the power supply system and ground system have each an inductance of 8nH.

Figure 11:
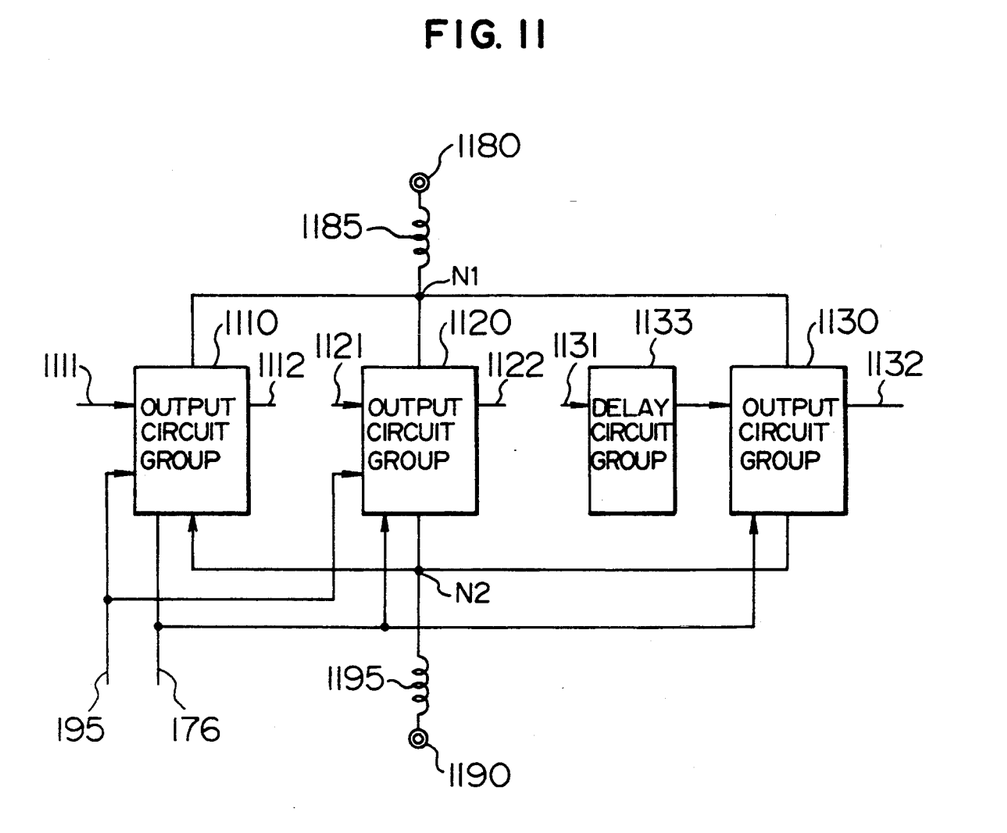
FIG. 11 is a schematic circuit diagram of a third embodiment of the semiconductor storage device according to the invention.

FIG. 11 shows a third embodiment of the semiconductor storage device according to the invention. As shown, the device comprises a first output circuit group 1110 including a plurality of output circuits, a second output circuit group 1120 including a plurality of output circuits, a third output circuit group 1130 including a plurality of output circuits, a power supply pin 1180, and a ground pin 1190. A parasitic inductance 1185 takes place between the power supply pin 1180 and a power supply node N1 and a parasitic inductance 1195 take place between the ground pin 1190 and a ground node N2.

In the present embodiment, the output circuit groups 1110 and 1120 operate in the same manner as the output circuit groups 1010 and 1020 of the FIG. 10 embodiment. The input of the output circuit group 1130 is preceded by a delay circuit group 1133 which delays output signal 1131 of the sense circuit group 150 by a predetermined delay time so that the output circuit group 1130 is switched later than the output circuit groups 1110 and 1120 by the predetermined time. Drive currents of the output circuit groups 1110 and 1120 are drawn to the power supply and ground at time which is different from time that drive currents of the output circuit group 1130 are drawn to the power supply and ground, thereby suppressing noise due to simultaneous driving. In the present embodiment, however, because of the delay circuit group 1133, the delay time of the output circuit group 1130 is increased as compared to the FIG. 10 embodiment but the present embodiment is effective for noise reduction in the case where the number of power supply pins and ground pins is limited in an ultra-wide bit output memory of, for example, ×24 output or ×32 output.

Figure 12:
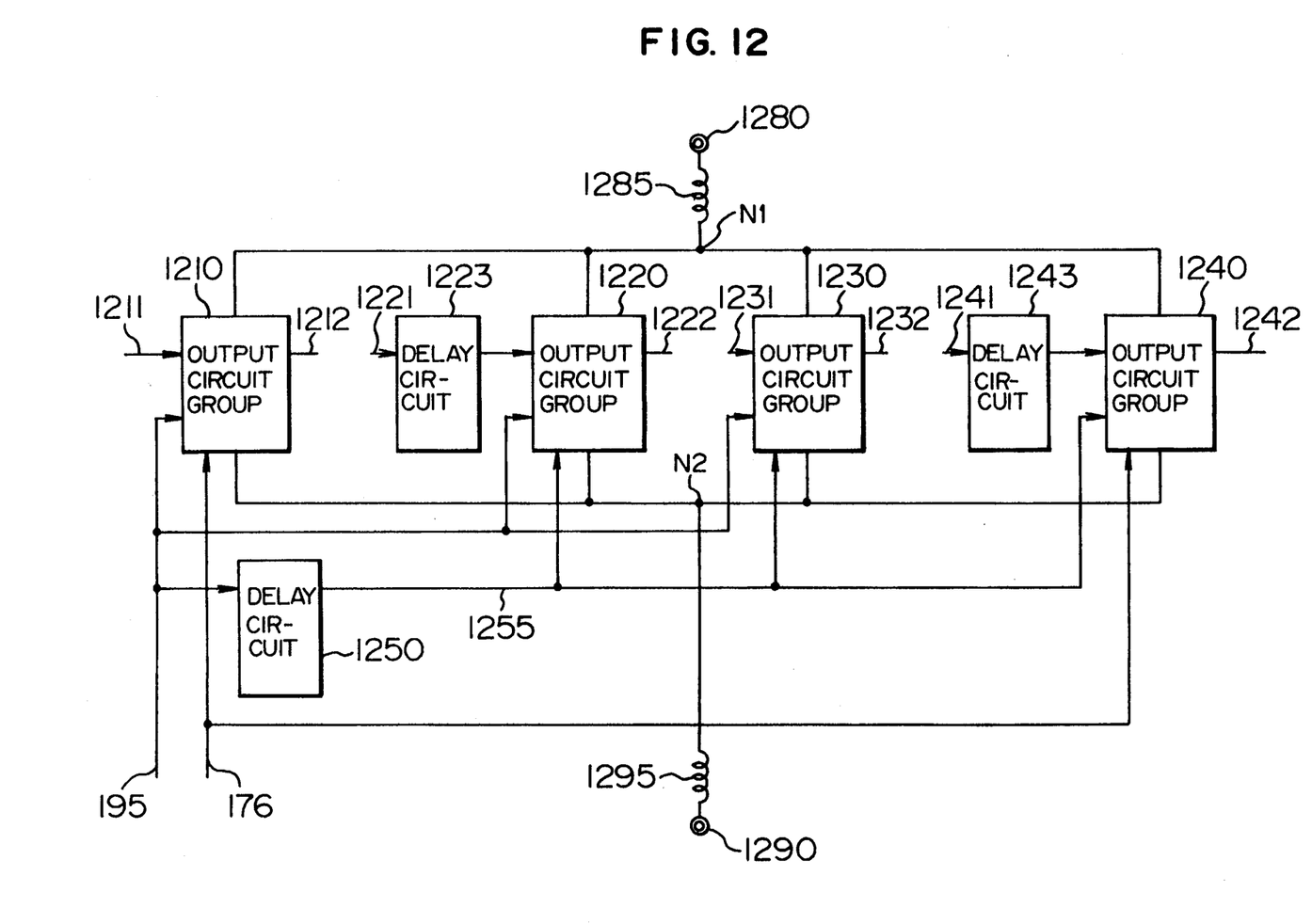
FIG. 12 is a schematic circuit diagram of a fourth embodiment of the device according to the invention.

FIG. 12 shows a fourth embodiment of the semiconductor storage device according to the invention. As shown, the device comprises a first output circuit group 1210 including a plurality of output circuits, a second output circuit group 1220 including a plurality of output circuits, a third output circuit group 1230 including a plurality of output circuits, a fourth output circuit group 1240 including a plurality of output circuits, a power supply pin 1280, and a ground pin 1290. A parasitic inductance 1285 takes place between the power supply pin 1280 and a power supply node N1 and a parasitic inductance 1295 takes place between the ground pin 1290 and a ground node N2.

In the present embodiment, the output circuit groups 1210 and 1230 operate in the same way as the output circuit groups 1010 and 1020 of the FIG. 10 embodiment. The output signal 195 of the PDG circuit is delayed by a delay circuit 1250 to provide a delayed signal 1225 which is applied to the output circuit groups 1220 and 1240, and the inputs of the output circuit groups 1220 and 1240 are preceded by delay circuit groups 1223 and 1243, respectively, whereby the output circuit groups 1220 and 1240 are driven toward the high level and low level, respectively, later than the output circuit groups 1210 and 1230 by a predetermined delay time and driving of the output circuit groups 1220 and 1240 by output signals 1221 and 1241 of the sense circuit is also delayed by a predetermined delay time. Accordingly, drive currents of the output circuit groups 1210 and 1230 are drawn to the power supply and ground at time which is different from time that drive currents of the output circuit groups 1220 and 1240 are drawn to the power supply and ground, thereby suppressing noise due to simultaneous driving. In the present embodiment, however, because of the delay circuit groups 1223 and 1243, the delay time of the output circuit groups 1220 and 1240 is also increased as compared to the FIG. 10 embodiment but the present embodiment is effective for noise reduction in the case where the number of power supply pins and ground pins is limited in an ultra-wide bit output memory of, for example, ×24 output or ×32 output.

Figure 13:
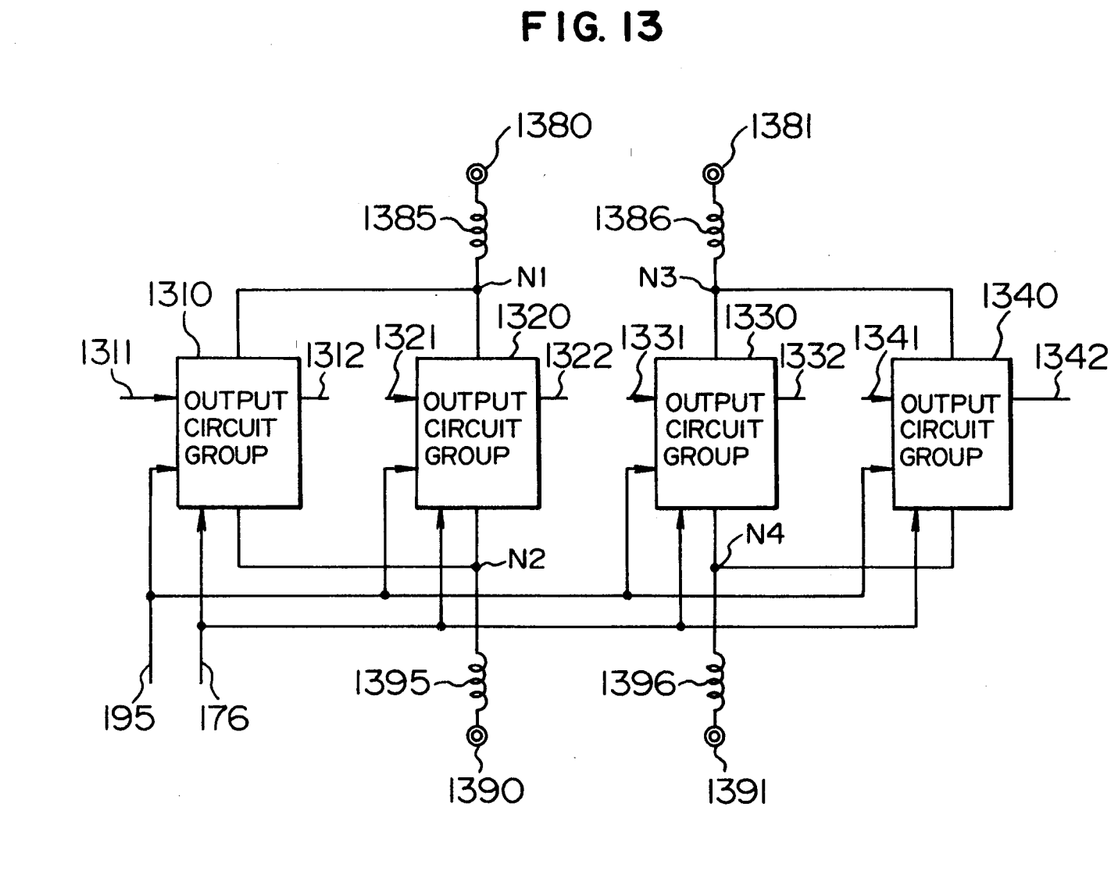
FIG. 13 is a similar diagram showing a fifth embodiment of the device according to the invention.

FIG. 13 shows a fifth embodiment of the semiconductor storage device according to the invention shown, the device comprises a first output circuit group 1310 including a plurality of output circuits, a second output circuit group 1320 including a plurality of output circuits, a third output circuit group 1330 including a plurality of output circuits, a fourth output circuit group 1340 including a plurality of output circuits, a first power supply pin 1380, a first ground pin 1390, a second power supply pin 1381, and a second ground pin 1391. A parasitic inductance 1385 takes place between the power supply pin 1380 and a power supply node N1, a parasitic inductance 1395 takes place between the ground pin 1390 and a ground node N2, a parasitic inductance 1386 takes place between the power supply pin 1381 and a-power supply node N3, and a parasitic inductance 1396 takes place between the ground pin 1391 and a ground node N4.

In the present embodiment, two pairs of power supply pin and ground pin are used, and a set of the output circuit groups 1310 and 1320 and a set of the output circuit groups 1330 and 1340 operate in the same way as the output circuit groups 1010 and 1020 of the FIG. 10 embodiment. But since the impedance of the power supply system is halved, twice the number of output circuits can be driven for the same speed and noise level as those of the FIG. 10 embodiment. Therefore, a high-speed memory of ultra-wide bit output such as ×24 output or ×32 output can be realized.

Figure 14:
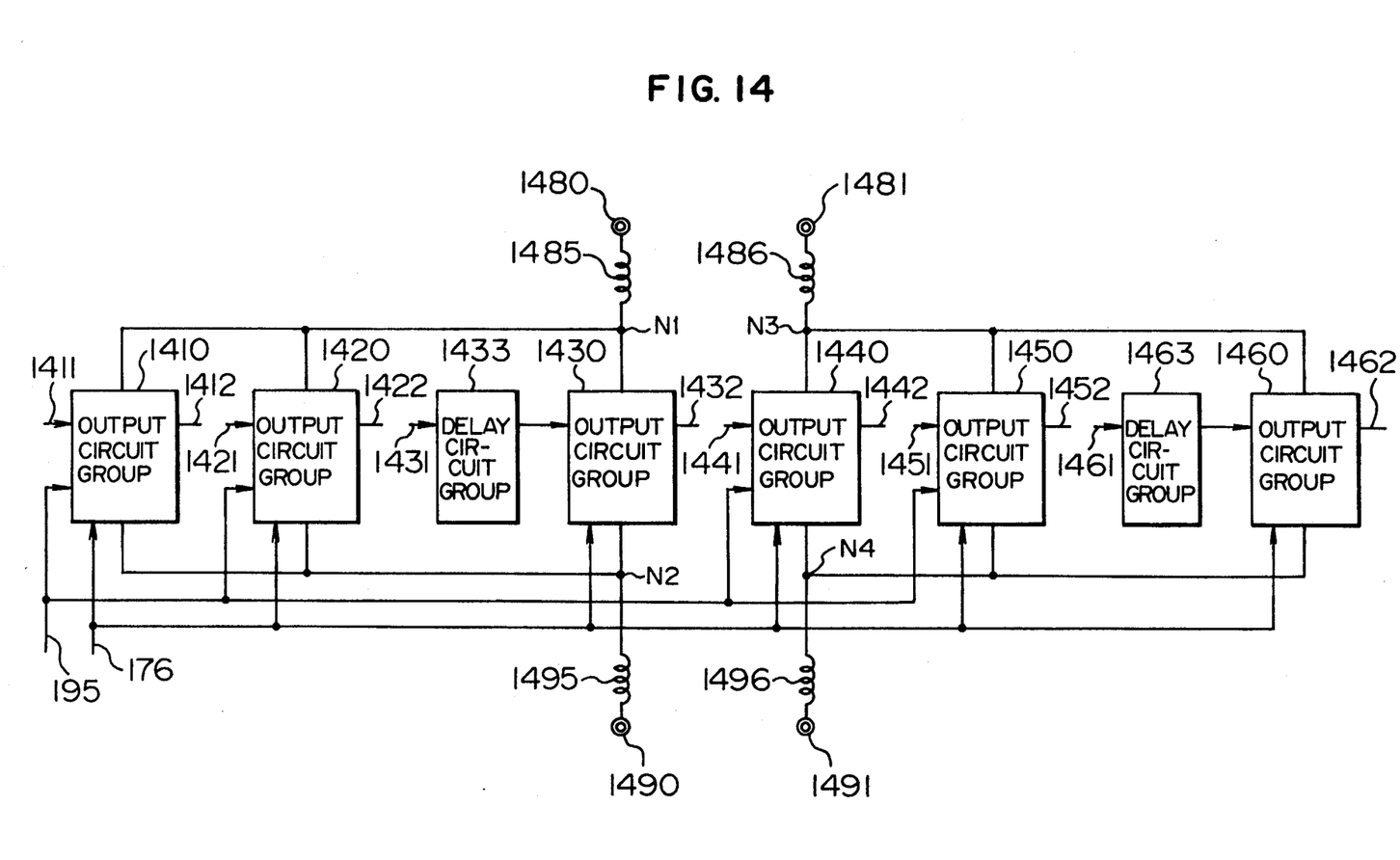
FIG. 14 is a similar diagram showing a sixth embodiment of the device according to the invention.

FIG. 14 shows a sixth embodiment of the semiconductor storage device according to the invention. As shown, the device comprises a first output circuit group 1410 including a plurality of output circuits, a second output circuit group 1420 including a plurality of output circuits, a third output circuit group 1430 including a plurality of output circuits, a fourth output circuit group 1440 including a plurality of output circuits, a fifth output circuit group 1450 including a plurality of output circuits, a sixth output circuit group 1460 including a plurality of output circuits, a first power supply pin 1480, a first ground pin 1490, a second power supply pin 1481, and a second ground pin 1491. A parasitic inductance 1485 takes place between the power supply pin 1480 and a power supply node N1, a parasitic inductance 1495 takes place between the ground pin 1490 and a ground node N2, a parasitic inductance 1486 takes place between the power supply pin 1481 and a power supply node N3, and a parasitic inductance 1496 takes place between the ground pin 1491 and a ground node N4.

In the present embodiment, two pairs of power supply pin and ground pin are used, and a set of the output circuit groups 1410 and 1420 and a set of the output circuit groups 1440 and 1450 operate in the same way as the output circuit groups 1010 and 1020 of the FIG. 10 embodiment. The output circuit groups 1430 and 1460 are not controlled by the output signal 195 of the PDG circuit and output signals 1431 and 1461 of the sense circuit are connected to delay circuit groups 1433 and 1463. Accordingly, the output circuit groups 1430 and 1460 are driven at time different from time that the other output Circuit groups are driven, at the sacrifice of high-speed operation by a delay time of the delay circuit groups 1433 and 1463, but in the present embodiment noise level suppression comparable to that in the FIG. 13 embodiment can be accomplished for the number of output circuit groups which is 1.5 times as large as the number of output circuit groups in the FIG. 13 embodiment. Therefore, the present embodiment is effective for noise reduction in an ultra-wide bit output memory of, for example, ×24 output or ×32 output.

Figure 16:
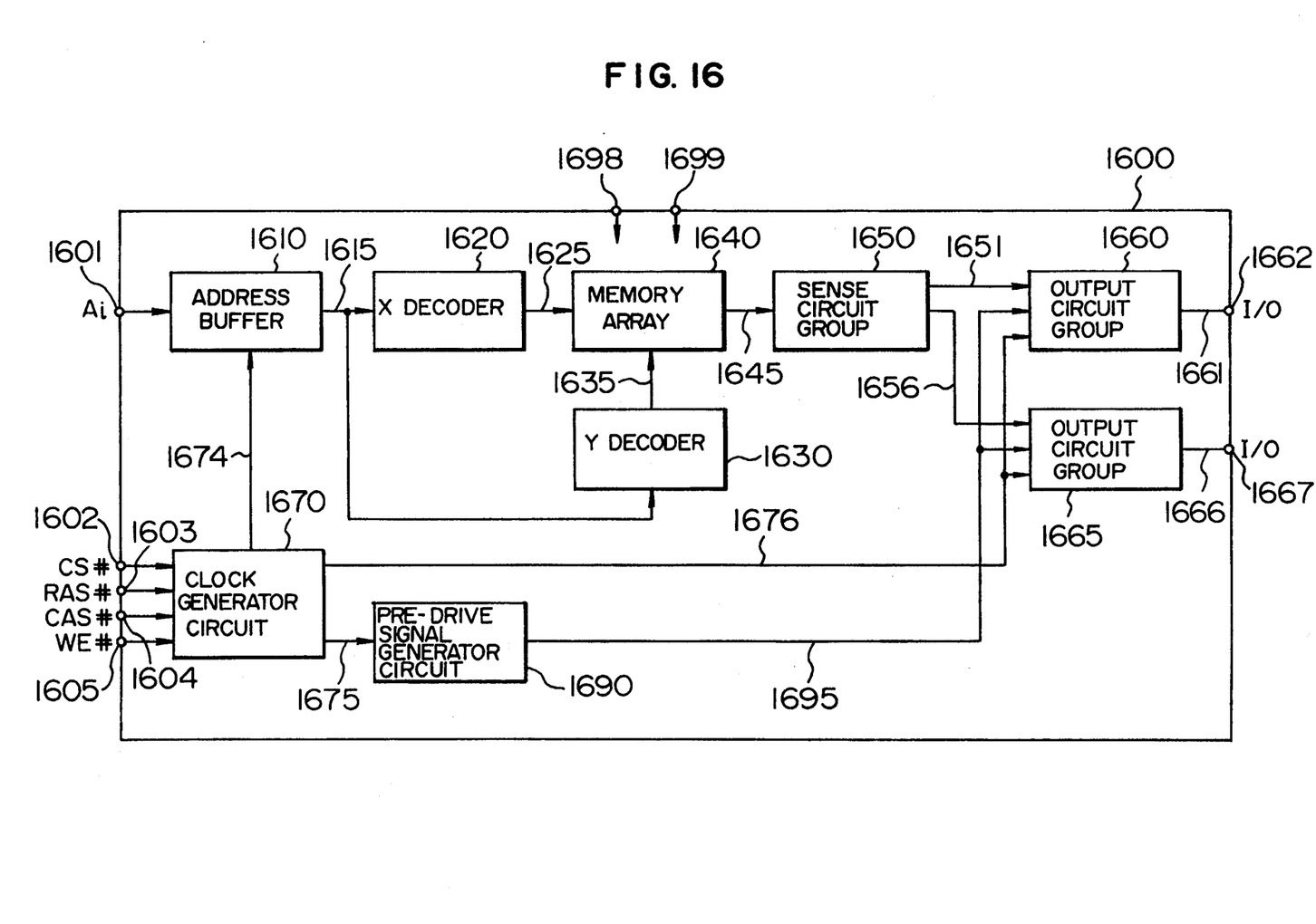
FIG. 16 is a block diagram of a seventh embodiment of the device according to the invention.

FIG. 16 is a block diagram showing a DRAM of a seventh embodiment of the device according to the invention. As shown, the DRAM has a chip 1600. An address buffer 1610 receives a plurality of address signals Ai at a terminal 1601 to distribute them to internal circuits and includes an internal latch. An X decoder 1620 and a Y decoder 1630 respectively receive an output signal 1615 of the buffer 1610 to produce output signals 1625 and 1635, which are used as a selection signal for a memory array 1640. An output signal 1645 of the memory array are amplified by a sense circuit group 1650 and delivered to signal lines 1651 and 1656. Output circuit groups 1660 and 1665 each include, for example, 8 output buffers, and the output circuit group 1660 delivers the input signal 1651 to an input/output terminal 1662 and the output circuit group 1665 delivers the input signal 1656 to an input/output terminal 1667. A clock generator circuit 1670 receives a chip select signal CS # at a terminal 1602, a row address strobe signal RAS # at a terminal 1603, a column address strobe signal CAS# at a terminal 1604 and a write enable signal WE # at a terminal 1605 and generates various kinds of control signals necessary for read/write operation including an address latch signal 1674. A signal 1675 becomes true in association with the CAS # signal during read operation and a signal 1676 controls operation enable of the output circuit groups 1660 and 1665. A PDG circuit 1690 responds to the signal 1675 to generate a pulse signal 1695 for driving the output circuit groups 1660 and 1665. Denoted by 1698 and 1699 are an internal power supply terminal and an internal ground terminal.

In the present embodiment, during read access, the signal 1695 from the PDG circuit 1690 drives the output circuit group 1660 toward a high level (or a low level) in advance of delivery of the read signal 1651 and the output circuit group 1665 toward the low level (or the high level) in advance of delivery of the read signal 1656. At expiration of a predetermined time interval, the signal 1695 is disabled and thereafter the output circuit groups 1660 and 1665 are driven by the read signals 1651 and 1656 to deliver read data 1661 and 1666 to the terminals 1662 and 1667, respectively.

Accordingly, the output circuit groups 1660 and 1665 are always driven to the opposite levels. Therefore, while one of the output circuit groups draws current from the power supply terminal 1698, the other passes current to the ground terminal 1699, so that noises generated on the power supply and ground lines owing to simultaneous driving can be halved. The terminals 1662 and 1667 are also connected with input circuit groups which are not directly related to the present invention and will not be described herein.

Figure 17:
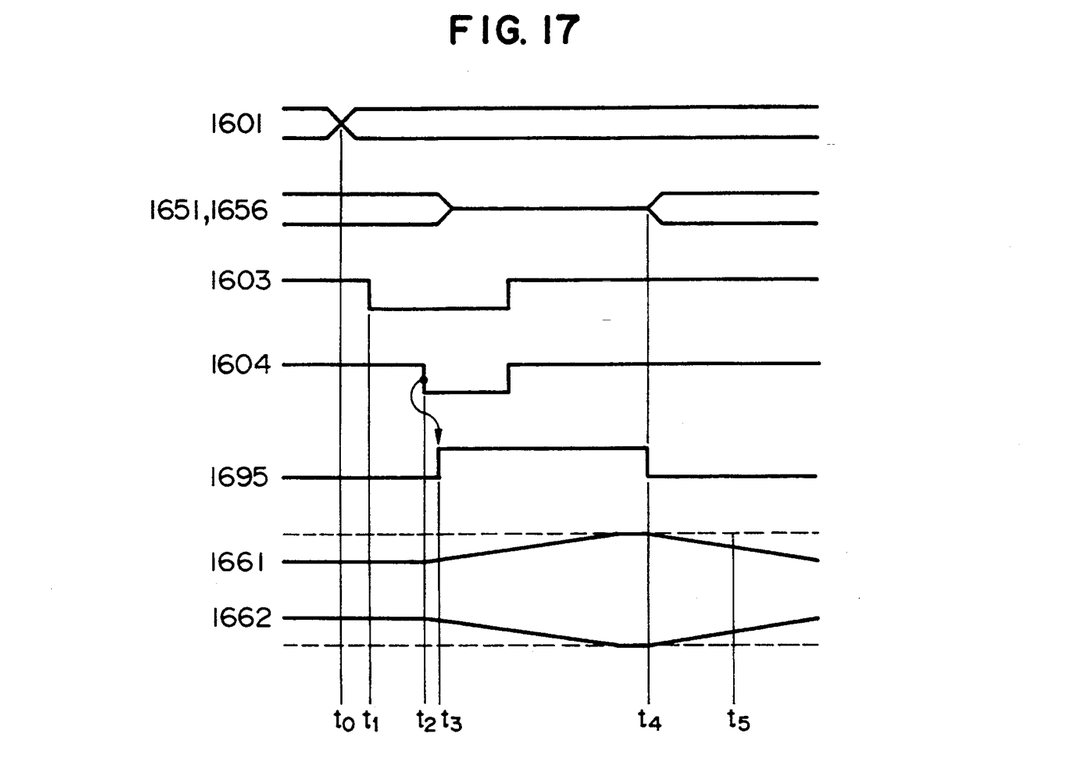
FIG. 17 is a time chart showing operation of the seventh embodiment.

FIG. 17 is a time chart of operation of the DRAM according to the present embodiment of the invention. As shown , after the address signal 1601 changes at time to, the output signals 1651 and 1656 of the sense circuit group are delivered at time t4. On the other hand, the RAS # signal 1603 and CAS# signal 1604 fall at times t1 and t2, respectively, with the result that a row address and a column address are fetched into the address buffer 1610. The output signal 1695 of the PDG circuit is delivered in association with the CAS# signal 1604 and is rendered to be high level during an interval of time from t3 to t4. Of the output signals 1661 from the output circuit group 1660, those assuming the low level are driven toward the high level during the period for the high level of signal 1695 as shown in the figure and after time t4, they are either kept to be high level or driven toward the low level in accordance of the level of signal 1651 and then read out at time t5. Similarly, of the output signals 1666 from the output circuit group 1665, those assuming the high level are driven toward the low level during the period for the high level of signal 1695 as shown in the figure and after time t4, they are either kept to be low level or driven toward the high level in accordance with the level of signal 1656 and then read out at time t5.

In the foregoing description, the invention achieved by the present inventor is described as being applied to the SRAM and DRAM but the invention is in no way limited thereto and may also be applied to other memory devices of wide-bit output, for example, ROM's to attain similar effects. The application of the invention to the semiconductor storage device is not limitative and it may also be applied extensively to the other types of semiconductor integrated circuits for driving a number of output circuits at a time, such as a microprocessor.

As described above, according to the invention, low-noise, high-speed wide-bit output semiconductor storage device and semiconductor integrated circuit device can advantageously be realized.

We claim:

1. A semiconductor storage device comprising:
   a plurality of memory cells;
   an address buffer circuit to which signals representative of addresses of said plurality of memory cells are inputted;
   an address decoder circuit responsive to a signal delivered out of said address buffer circuit to select at least one of said plurality of memory cells;
   a sense circuit connected to said plurality of memory cells to sense data storage in said plurality of memory cells;
   output circuits grouped into a plurality of groups and operative to convert signals delivered out of said sense circuit into signals of predetermined levels of potential and to deliver the converted signals; and
   pre-drive means responsive to said signal delivered out of said address buffer circuit for driving a predetermined group of said output circuits toward a first level of potential and another predetermined group of said output circuits toward a second level of potential in advance of delivery of output signals from said sense circuit.

2. A semiconductor storage device according to claim 1 wherein said pre-drive means comprises a detection circuit for detecting a read access start signal for said memory cells, and a pre-drive signal generator circuit responsive to an output signal of said detection circuit to generate a pre-drive signal.

3. A semiconductor storage device according to claim 1 wherein said output circuits are sorted into at least two groups.

4. A semiconductor storage device according to claim 2 wherein said pre-drive signal generator circuit is a circuit for delivering a signal of a predetermined time width (tw).

5. A semiconductor storage device according to claim 1 wherein said output circuit comprises a first transistor connected between a first potential portion and an output terminal, and a second transistor connected between said output terminal and a second potential portion, each of said first and second transistors being responsive to the output signal of said pre-drive means to establish a current path between said first potential portion and said output terminal or between said output terminal and said second potential portion.

6. A semiconductor storage device comprising:
   a memory array including a plurality of memory cells;
   a sense circuit group connected to said memory array to sense data stored in at least one memory cell selected from said plurality of memory cells;
   at least two output circuit groups operative to convert signals delivered out of said sense circuit groups into signals of predetermined levels of potential and to deliver the converted signals, each of said output circuit groups including a plurality of output circuits each having a first transistor connected between a first potential portion and an output terminal and a second transistor connected between said output terminal and a second potential portion; and
   pre-drive means responsive to a memory access start signal for selection of a memory cell for driving the output terminals of respective output circuits comprising a predetermined output circuit group toward a first level of potential and the output terminals of respective output circuits comprising another predetermined output circuit group toward a second level of potential.

7. A semiconductor storage device according to claim 6 wherein each of said first and second transistors comprising the output circuits is responsive to the memory access start signal to establish a current path between said first potential portion and said output terminal or between said output terminal and said second potential portion.

8. A semiconductor storage device according to claim 6 wherein said pre-drive means comprises a pre-drive signal generator circuit for delivering a signal of a predetermined time width (tw).

9. A semiconductor storage device comprising:
   a memory array including a plurality of memory cells;
   a sense circuit group connected to said memory array to sense data stored in at least one memory cell selected from said plurality of memory cells;
   at least three output circuit groups operative to convert signals delivered out of said sense circuit groups into signals of predetermined levels of potential and to deliver the converted signals, each of said output circuit groups including a plurality of output circuits each having a first transistor connected between a first potential portion and an output terminal and a second transistor connected between said output terminal and a second potential portion;
   a read control circuit for controlling an operation of reading data from said memory array;
   pre-drive means responsive to a memory access start signal for selection of a memory cell and a control signal from said control circuit for driving the output terminals of respective output circuits comprising a predetermined output circuit group toward a first level of potential and the output terminals of respective output circuits comprising another predetermined output circuit group toward a second level of potential; and
   a delay circuit group for delaying a read data signal delivered out of said sense circuit group by a predetermined delay time and delivering a delay signal to a plurality of output circuits comprising still another predetermined output circuit group.

10. A semiconductor storage device according to claim 9 wherein each of said first and second transistors comprising the output circuits is responsive to the memory access start signal to establish a current path between said first potential portion and said output terminal or between said output terminal and said second potential portion.

11. A semiconductor storage device according to claim 9 wherein said delay circuit group delays the read data signal delivered out of said sense circuit group until said predetermined output circuit group is driven toward said first level of potential and said another predetermined output circuit group is driven toward said second level of potential.

12. A semiconductor storage device comprising a plurality of memory cells, an address decoder, an address driver, a sense circuit, input/output circuits and a read/write control circuit, wherein a plurality of output circuits allotted to a pair of power supply pins are sorted into two groups, one of said two output circuit groups is driven by a signal associated with read access toward a high level of potential in advance of delivery of read data from the memory and thereafter driven in accordance with the read data, and the other output circuit group is driven by the signal associated with read access toward a low level of potential in advance of the read data delivery and thereafter driven in accordance with the read data.

13. A semiconductor storage device comprising a plurality of memory cells, an address decoder, an address driver, a sense circuit, input/output circuits and a read/write control circuit, wherein a plurality of output circuits allotted to a pair of power supply pins are sorted into three or more groups, a first output circuit group is driven by a signal associated with read access toward a high level of potential in advance of delivery of read data from the memory and thereafter driven in accordance with the read data, a second output circuit group is driven by the signal associated with read address toward a low level of potential in advance of the read data delivery and thereafter driven in accordance with the read data, and a third output circuit group is driven by read data which is delayed by a predetermined time.

14. A semiconductor storage device comprising a plurality of memory cells, an address decoder, an address driver, a sense circuit, input/output circuits and a read/write control circuit, wherein a plurality of output circuits allotted to a pair of power supply pins are sorted into four groups, a first output circuit group is driven by a signal associated with read access toward a high level of potential in advance of delivery of read data from the memory and thereafter driven in accordance with the read data, a second output circuit group is driven by a delayed read access associated signal toward the high level of potential later than said first output circuit groups by a predetermined time in advance of the read data delivery and thereafter driven in accordance with read data which is delayed by a predetermined time, a third output circuit group is driven by the read access associated signal toward the low level of potential in advance of the read data delivery and thereafter driven in accordance with the read data, and a fourth output circuit group is driven by the delayed read access associated signal toward the low level of potential later than said third output circuit group by a predetermined time in advance of the read data delivery and thereafter driven in accordance with read data which is delayed by a predetermined time.

15. A semiconductor storage device comprising a plurality of memory cells, an address decoder, an address driver, a sense circuit, input/output circuits and a read/write control circuit, wherein a plurality of output circuit groups are allotted to a plurality of pairs of power supply pins, two output circuit groups are allotted to each pair of power supply pins, one of said two output circuit groups is driven by a signal associated with read access toward a high level of potential in advance of delivery of read data from the memory and thereafter driven in accordance with read data, and the other output circuit group is driven by the read access associated signal toward a low level of potential in advance of the read data delivery and thereafter driven in accordance with the read data.

16. A semiconductor storage device comprising a plurality of memory cells, an address decoder, an address driver, a sense circuit, input/output circuits and a read/write control circuit, wherein a plurality of output circuit groups are allotted to a plurality of pairs of power supply pins, three or more output circuit groups are allotted to each pair of power supply pins, a first output circuit group is driven by a signal associated with read access toward a high level of potential in advance of delivery of read data from the memory and thereafter driven in accordance with read data, a second output circuit group is driven by the read access associated signal toward a low level of potential in advance of the read data delivery and thereafter driven in accordance with the read data, and a third output circuit group is driven in accordance with read data which is delayed by a predetermined time.

17. A semiconductor storage device of 4N-bit output comprising a plurality of memory cells, an address decoder, an address driver, a sense circuit, input/output circuits and a read/write control circuit, wherein at least one output circuit is driven toward a high level of potential in advance of delivery of read data form the memory and thereafter driven in accordance with read data, and at least another output circuit is driven toward a low level of potential in advance of the read data delivery and thereafter driven in accordance with the read data.

18. A semiconductor storage device of 9N-bit output comprising a plurality of memory cells, an address decoder, an address driver, a sense circuit, input/output circuits and a read/write control circuit, wherein at least one output circuit is driven toward a high level of potential in advance of delivery of read data form the memory and thereafter driven in accordance with read data, and at least another output circuit is driven toward a low level of potential in advance of the read data delivery and thereafter driven in accordance with the read data.

19. A semiconductor integrated circuit device comprising at least one pair of power supply pins and a plurality of output circuits, wherein at least one of said plurality of output circuits is driven by a signal associated with output control toward a high level of potential in advance of delivery of an input signal and thereafter driven in accordance with the input signal, and at least another output circuit is driven by the output control associated signal toward a low level of potential in advance of the input signal delivery and thereafter driven in accordance with the input signal.

20. A semiconductor integrated circuit device comprising at least one pair of power supply pins and a plurality of output circuits, wherein at least one of said plurality of output circuits is driven by a signal associated with output control toward a high level of potential in advance of delivery of an input signal and thereafter driven in accordance with the input signal, at least another output circuit is driven by the output control associated signal toward a low level of potential in advance of the input signal delivery and thereafter driven in accordance with the input signal, and at least still another output circuit is driven in accordance with the input signal which is delayed by a predetermined time.

21. A dynamic random access memory comprising:
a plurality of memory cells;
a clock generator circuit for receiving a chip selection signal, a row address strobe signal, a column address strobe signal and a write signal and generating a plurality of signals for control of internal operation;
an address buffer circuit supplied with signals representative of addresses of said plurality of memory cells;
an address decoder circuit responsive to a signal delivered out of said address buffer circuit to select at least one of said plurality of memory cells;
a sense circuit connected to said plurality of memory cells to sense data stored in said memory cells;
a plurality of output circuit groups each including output circuits converting signal delivered out of said sense circuit into signals of predetermined levels of potential and delivering the converted signals; and
pre-drive means responsive to the signal delivered out of said clock generator circuit for driving a predetermined output circuit group toward a first level of potential in advance of delivery of the output signal from said sense circuit and another predetermined output circuit group toward a second level of potential in advance of the output signal delivery.

22. A dynamic random access memory according to claim 21 wherein said pre-drive means generates a pre-drive signal in association with timing for changing the column address strobe signal.

23. A semiconductor storage device according to claim 15, wherein each output circuit of said output circuit groups delivers three values of a high level of potential a low level of potential and high impedance in response to an input signal and an output enable signal,
wherein said output circuit is provided to respond to a control signal to drive the output level to the high level or the low level when the output enable signal is true.

24. A semiconductor storage device according to claim 1, wherein said first level of potential is a high level of potential and said second level of potential is a low level of potential.

25. A semiconductor storage device according to claim 6, wherein said first level of potential is a high level of potential and said second level of potential is a low level of potential.

26. A semiconductor storage device according to claim 9, wherein said first level of potential is a high level of potential and said second level of potential is a low level of potential.

* * * * *